(12) United States Patent  
Kim et al.

(10) Patent No.: US 7,931,475 B2
(45) Date of Patent: Apr. 26, 2011

(54) SOLDERABLE ELASTIC ELECTRIC CONTACT TERMINAL

(75) Inventors: Sun-Ki Kim, Gunpo-si (KR); Sung-Ho Cho, Ansan-si (KR); Han-Jin Cheon, Seoul (KR); Hwan-min Yeo, Ansan-si (KR)

(73) Assignee: Joinset Co., Ltd. (KR)

( * ) Notice: Subject to any disclaimer, the term of this patent is extended or adjusted under 35 U.S.C. 154(b) by 10 days.

(21) Appl. No.: 12/393,948

(22) Filed: Feb. 26, 2009

(65) Prior Publication Data

US 2009/0227127 A1 Sep. 10, 2009

(30) Foreign Application Priority Data

Mar. 7, 2008 (KR) .................. 10-2008-0021640
Apr. 23, 2008 (KR) .................. 20-2008-0005393 U
Jul. 1, 2008 (KR) .................. 10-2008-0063460

(51) Int. Cl.
*H01R 12/00* (2006.01)

(52) U.S. Cl. ........................................ 439/66
(58) Field of Classification Search ........... 439/66; 174/35 GC, 52.1, 35 R
See application file for complete search history.

(56) References Cited

U.S. PATENT DOCUMENTS

| 4,601,963 | A | * | 7/1986 | Takahashi et al. ............ 430/69 |
| 4,703,134 | A | * | 10/1987 | Uematsu ................ 174/106 SC |
| 4,857,668 | A | * | 8/1989 | Buonanno .................... 174/354 |
| 5,064,388 | A | * | 11/1991 | Paladel .................. 439/607.23 |
| 5,597,652 | A | * | 1/1997 | Utsunomiya et al. ......... 428/382 |
| 6,255,581 | B1 | * | 7/2001 | Reis et al. ..................... 174/388 |
| 7,129,421 | B2 | | 10/2006 | Reis et al. |
| 7,382,995 | B2 | * | 6/2008 | Itoh et al. ......................... 399/67 |
| 7,771,213 | B2 | * | 8/2010 | Kim et al. ......................... 439/83 |
| 2002/0098018 | A1 | * | 7/2002 | Kamiya ........................ 399/323 |
| 2007/0189819 | A1 | * | 8/2007 | Uehara et al. ................ 399/333 |

FOREIGN PATENT DOCUMENTS

| EP | 1090538 B1 | 6/2003 |
| KR | 20-0390490 Y1 | 7/2005 |
| KR | 10-0783588 B1 | 12/2007 |

* cited by examiner

*Primary Examiner* — Jean F Duverne
(74) *Attorney, Agent, or Firm* — Park & Associates IP Law P.C.

(57) ABSTRACT

Provided is a solderable elastic electric contact terminal. The solderable elastic electric contact terminal includes a tube-shaped insulating elastic core, an insulating non-foam rubber coating layer adhered to the insulating elastic core to surround the insulating elastic core, and a heat-resistant polymer film having one surface adhered to the insulating non-foam rubber coating layer to surround the insulating non-foam rubber coating layer, and another surface integrally provided with a metal layer.

29 Claims, 8 Drawing Sheets

SOLDERABLE ELASTIC ELECTRIC CONTACT TERMINAL

FIELD OF THE INVENTION

The present invention relates to an electric contact terminal, and particularly, to an elastic electric contact terminal adapted to perform a soldering process on the elastic electric contact terminal while electrically and mechanically connecting an object to a printed circuit board. More particularly, the present invention relates to an elastic electric contact terminal adapted to perform a reflow soldering process with a surface mounting process on the elastic electric contact terminal.

BACKGROUND OF THE INVENTION

Generally, solderable elastic electric contact terminals must have high electrical conductivity and excellent elastic resilience and must be resistant to a soldering temperature.

Related art reflow-solderable electric contact terminals are formed mainly of metal. Specifically, beryllium copper is widely used for the electric contact terminals because it has excellent elastic resilience and high electrical conductivity. For example, a beryllium copper sheet, having a thickness of about 0.3 mm or less and a predetermined width, is blanked with a press mold to have a predetermined shape, and then is heat-treated to form the electric contact terminal having an improved elastic resilience.

However, the electric contact terminals formed of only the metal sheet, because of metal characteristics or structures, cannot provide excellent elasticity in a predetermined height or less. To increase the elasticity, the metal sheet must be bent in a predetermined shape to have a bent height that mainly determines the height of the electric contact terminal, so that the electric contact terminal cannot provide elasticity in a predetermined height or less. In addition, since a single press mold can form products having an identical shape, additional expensive press molds are needed to form products having different shapes. Furthermore, the light-weight electric contact terminal formed of a metal sheet can be moved by the wind supplied in a surface mounting process, thereby causing defect.

Another related art is disclosed in EP Patent EP 1090538 issued to Gore Enterprise Holdings Inc (US). According to this patent, an additional adhesive is needed to fix an electrically conductive gasket material and a solderable support layer, thereby causing inconvenience. Furthermore, the adhesive increases electric resistance.

Further another related art is disclosed in U.S. Pat. No. 7,129,421 issued to the Gore Enterprise Holdings Inc (US). According to this patent, a compression hole is provided to an electrically conductive gasket material, and an electrically conductive support layer, that goes through a crimp process, is provided to a bottom surface of the electrically conductive gasket material, thereby reducing the productivity of electro-magnetic interference (EMI) gasket assemblies. That is, after the electrically conductive gasket material is manufactured, the electrically conductive support layer, that is separately manufactured, is inserted into the compression hole of the electrically conductive gasket material and then pressed, thereby causing inconvenience. The compression hole has a smaller size than the EMI gasket assembly. Hence, a size of the electrically conductive support layer in the compression hole is limited thereby, so that an adhesive force is not sufficient between the electrically conductive gasket material and the electrically conductive support layer. That is, when the EMI gasket assembly is drawn in an upper direction, the electrically conductive gasket material is easily removed from the electrically conductive support layer.

SUMMARY OF THE INVENTION

An object of the present invention is to provide an elastic electric contact terminal having good elasticity and good electrical conductivity.

Another object of the present invention is to provide a solderable elastic electric contact terminal.

A further another object of the present invention is to provide an elastic electric contact terminal having low manufacturing costs and improved production efficiency.

A still further another object of the present invention is to provide an elastic electric contact terminal that is adapted for a surface-mounting process with a vacuum pick-up process, and a reflow-soldering process.

An even further another object of the present invention is to provide an elastic electric contact terminal that receives leakage of an insulating non-foam rubber coating layer to prevent the leakage from interfering in a soldering operation.

A yet further another object of the present invention is to provide an elastic electric contact terminal having similar lateral soldering strengths after a soldering process.

A yet further another object of the present invention is to provide an elastic electric contact terminal having upper and lower surfaces that are easily distinguished from each other without an additional distinguishing mark.

A yet further another object of the present invention is to provide an elastic electric contact terminal that can improve solder-rising phenomenon at both side surfaces thereof to have a reliable soldering strength.

A yet further another object of the present invention is to provide an elastic electric contact terminal that can achieve the arrangement of upper and lower surfaces through vibration in a reel packaging process and reduce movement of the electric contact terminal in a reflow soldering process, by disposing the center of gravity of the electric contact terminal in a lower part.

A yet further another object of the present invention is to provide an elastic electric contact terminal that limits the maximum range where the electric contact terminal can be pressed.

A yet further another object of the present invention is to provide an elastic electric contact terminal that can reliably maintain a top thereof in a plane.

According to an aspect of the present invention, there is provided a solderable elastic electric contact terminal including: a tube-shaped insulating elastic core; an insulating non-foam rubber coating layer adhered to the insulating elastic core to surround the insulating elastic core; and a heat-resistant polymer film having one surface adhered to the insulating non-foam rubber coating layer to surround the insulating non-foam rubber coating layer, and another surface integrally provided with a metal layer.

According to another aspect of the present invention, there is provided a solderable elastic electric contact terminal including: a tube-shaped insulating elastic core including a through hole in an inner portion thereof; an insulating non-foam rubber coating layer adhered to the insulating elastic core to surround the insulating elastic core; and a heat-resistant polymer film having one surface adhered to the insulating non-foam rubber coating layer to surround the insulating non-foam rubber coating layer, and another surface integrally provided with a metal layer; wherein the heat-resistant polymer film is adhered to the insulating non-foam rubber coating layer such that both ends of the heat-resistant polymer film are spaced apart from each other, and when the heat-resistant polymer film is adhered to the insulating non-foam rubber coating layer, a leakage of the insulating non-foam rubber coating layer sticking out of the both ends of the heat-resistant polymer film is received in a receiving space defined by the spaced both ends of the heat-resistant polymer film.

According to a further another aspect of the present invention, there is provided a solderable elastic electric contact terminal including: a tube-shaped insulating elastic core; a metal reinforcement on a bottom of the insulating elastic core; an insulating non-foam rubber coating layer adhered to both the metal reinforcement and the insulating elastic core to surround both the metal reinforcement and the insulating elastic core; and a heat-resistant polymer film having one surface adhered to the insulating non-foam rubber coating layer to surround the insulating non-foam rubber coating layer, and another surface integrally provided with a metal layer; wherein both ends of the heat-resistant polymer film is spaced a predetermined distance from each other.

According to a still further another aspect of the present invention, there is provided a solderable elastic electric contact terminal including: a tube-shaped insulating elastic core; an insulating non-foam rubber coating layer adhered to the insulating elastic core to surround the insulating elastic core; and a heat-resistant polymer film having one surface adhered to the insulating non-foam rubber coating layer to surround the insulating non-foam rubber coating layer, and another surface integrally provided with a metal layer, wherein a heat-resistant double-sided adhesive tape is attached to a portion of a bottom of the metal layer, and the heat-resistant double-sided adhesive tape is directly adhered to a printed circuit board.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE INVENTION

Now, preferred embodiments of the present invention will be described in detail with reference to the accompanying drawings.

1. One Embodiment

Figure 1:
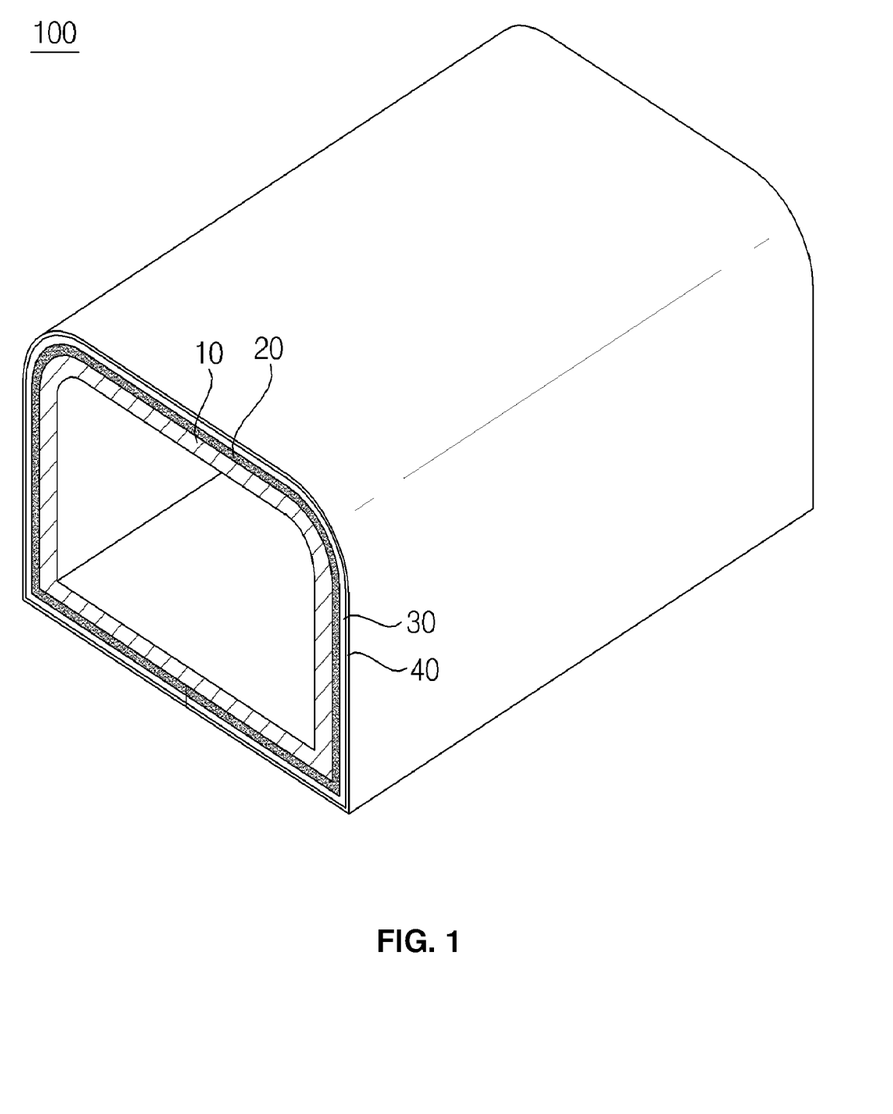
FIG. 1 is a view of an electric contact terminal according to an embodiment of the present invention.

FIG. 1 is a view of an electric contact terminal 100 according to one embodiment of the present invention.

Referring to FIG. 1, the elastic electric contact terminal 100 includes a tube-shaped insulating elastic core 10, an insulating non-foam rubber coating layer 20, and a heat-resistant polymer film 30 having a metal layer 40 provided to a surface thereof, which are sequentially stacked.

In this structure, the tube-shaped elastic core manufactured through an extrusion process is applied, thereby reducing manufacturing costs, adjusting an elastic force and a pressing force to control the size of a through hole of the tube, and efficiently manufacturing a small product. Also, the insulating non-foam rubber coating layer maintains an adhesive force and an elastic force before and after a soldering process and during a repeated compression test. Also, the heat-resistant polymer film including the metal layer meets a soldering condition and improves flexibility and maintains an elastic force during a compression test, and the metal layer is adapted for a soldering process using a solder cream.

1.1 Insulating Elastic Core 10

Referring to FIG. 1, the insulating elastic core 10 is disposed at the most inner part and has a tube shape, which has a tetragonal cross-section in this embodiment. However, the cross-section of the insulating elastic core 10 is not limited thereto, and may vary according to an extrusion process. For example, in the cross-section of the insulating elastic core 10, the thickness of both sidewalls may be less than that of top and bottom walls to improve flexibility and reduce a pressing force.

The insulating elastic core 10 may be formed of a non-foam heat-resistant elastic rubber, e.g., a silicon rubber to meet reflow soldering and elasticity conditions.

Also, the hardness of the insulating elastic core 10 may range from Shore A 40 to 70 for appropriate mechanical strength and elasticity.

Also, both edges of a top of the insulating elastic core 10 may be rounded. This structure is easy to handle and prevents the catch on both sides in the process where the completed electric contact terminal 100 is attached to a printed circuit board through a soldering process and then coupled to a facing object.

Also, the insulating elastic core 10 may have a different color from that of the metal layer 40.

1.2 Insulating Non-Foam Rubber Coating Layer 20

The insulating non-foam rubber coating layer 20 is disposed between the insulating elastic core 10 and the heat-resistant polymer film 30 to reliably adhere the insulating elastic core 10 to the heat-resistant polymer film 30. Furthermore, the insulating non-foam rubber coating layer 20 is required to maintain the adhesive force before and after the soldering process, and maintain elasticity at all times. For example, for flexibility and elasticity, when the insulating non-foam rubber coating layer 20 is completely hardened, the hardness of the insulating non-foam rubber coating layer 20 may range from Shore A 20 to 60, and the thickness thereof may range from about 0.02 mm to 0.2 mm.

The insulating non-foam rubber coating layer 20 may be formed by hardening a liquid silicon rubber that is the selected one of a silicon rubber hardened by heat and a silicon rubber hardened by moisture. For example, to increase working speed, the rubber completely hardened by heat may be used.

The liquid silicon rubber is adhered to a facing object during hardening, and the insulating non-foam rubber coating layer 20 is in a solid state after the hardening. The hardened insulating non-foam rubber coating layer 20 maintains the elasticity and the adhesive force against reheating. For example, to obtain a reliable adhesive force, an adhesion enhancer is added to a liquid silicon rubber, or a surface-treating process including corona treating is performed on an object for adhesion, that is, the elastic core 10 or the heat-resistant polymer film 30.

For example, a piezoelectric powder or a magnetic powder such as ferrite may be mixed with a liquid silicon rubber and hardened such that the insulating non-foam rubber coating layer 20 have magnetic or piezoelectric characteristics. In this case, the noise of current flowing through the metal layer 40 can be removed.

1.3 Heat-Resistant Polymer Film 30

The heat-resistant polymer film 30 may be, e.g., one of a polyimide (PI) film having good heat resistance and other heat-resistant polymer films, and have a thickness, e.g., ranging from about 0.01 mm to 0.05 mm considering flexibility and mechanical strength.

Also, the metal layer 40 is integrally formed with an outer surface of the heat-resistant polymer film 30. In here, a predetermined portion of the metal layer 40 is removed using an etching process to improve the flexibility of the heat-resistant polymer film 30, or the metal layer 40 is divided into an electrically insulated plurality of portions using an etching process, and a ground pattern, to which an elastic electric contact terminal is soldered, is divided into a plurality of patterns having an insulating gap to correspond to each of a plurality of portions, so that the single electric contact terminal 100 may be used as a plurality of electric contact terminals.

For example, the metal layer 40 may include a plurality of metal layers, and the metal layer 40 may be formed by sputtering metal on the heat-resistant polymer film 30, and then by plating the heat-resistant polymer film 30 with metal. For example, one layer of the metal layer 40 may be formed using a copper-plating process, and a main component of the entire metal layer 40 may be copper. The most outer surface of the metal layer 40 includes any one of tin, silver, and gold to prevent corrosion and improve a soldering process using a solder cream. For example, for the metal layer 40 to have a strong soldering strength, a good electric transmittance, and a strong adhesive force to a heat-resistant polymer film, metal is coated on the heat-resistant polymer film using a sputtering process, then the copper-plating process is performed on the heat-resistant polymer film, and then a tin-plating process is performed on the heat-resistant polymer film. The metal layer 40 may have a thickness, e.g., ranging from about 0.002 mm to 0.01 mm considering flexibility or soldering characteristics and soldering strength.

Meanwhile, the heat-resistant polymer film 30 provided with the metal layer 40, e.g., may be a single-sided flexible copper clad laminate (FCCL).

1.4 Method of Manufacturing Electric Contact Terminal 100

Hereinafter, a method of manufacturing the electric contact terminal 100 will now be described.

A liquid silicon rubber hardened by heat is cast, using a casting machine, into a liquid silicon rubber coating layer having a thickness ranging from about 0.02 mm to 0.2 mm on an insulated surface of the heat-resistant polymer film 30 having a constant width and including the metal layer 40 on the outer surface thereof. Meanwhile, the elastic core 10, manufactured in a roll shape using an extrusion process, is placed on the liquid silicon rubber coating layer and surrounded through a jig having a predetermined shape.

At this point, when the liquid silicon rubber coating layer is too thin, the adhesive force between the insulating elastic core 10 and the heat-resistant polymer film 30 is decreased, and when the coating layer is too thick, it takes a lot of time to harden the liquid silicon rubber. When the coating layer is formed of a liquid silicon rubber hardened by moisture, a coating process may be performed in a nitrogen or vacuum atmosphere.

Thereafter, the heat-resistant polymer film 30 surrounding the insulating elastic core 10 is located at a mold having similar dimensions to those of the insulating elastic core 10, and the liquid silicon rubber coating layer is hardened by heat, disposed between the insulating elastic core 10 and the heat-resistant polymer film 30. Then, the liquid silicon rubber coating layer is hardened and changed into the insulating non-foam rubber coating layer 20. At this point, the insulating non-foam rubber coating layer 20 adheres the elastic core 10 and the heat-resistant polymer film 30 to each other. That is, the liquid silicon rubber coating layer is hardened by heat in outer space and inner space of the high-temperature mold having the constant dimensions, and then the coating layer becomes the insulating non-foam rubber coating layer 20 having elasticity while serving as an adhesive for attaching the insulating elastic core 10 and the heat-resistant polymer film 30.

Since the hardened liquid silicon rubber is not melted again by heat, even when a soldering process is performed on the electric contact terminal 100, the silicon rubber maintains its original adhesive performance. At this point, to increase a hardening speed of the liquid silicon rubber located in the mold, a temperature of the mold is maintained at about 180 □, and an ambient humidity is maintained at about 60%.

In addition, since the electric contact terminal 100 is manufactured with the heat-resistant polymer film 30 having the outer surface provided with the metal layer 40, a long product is susceptible to wrinkling. Thus, the electric contact terminal 100 is generally manufactured with a length of about 1 m or less, and finally, cut to have a desired length of about 3 mm to 30 mm. Also, when a liquid silicon rubber, hardened by both moisture and heat, is used, a hardening time can be reduced.

An outer surface of the electric contact terminal 100 manufactured according to the above method is formed of the metal layer 40 to have a good electrical conductivity of about 0.01Ω or less, favorable soldering characteristics, and improved soldering strength. In this embodiment, the metal layer 40 is formed through sputtering and electroplating processes, and the main component of the metal layer 40 is copper plated with tin, and polyimide (PI) is used as the heat-resistant polymer film 30, and since a silicon rubber is used as the insulating elastic core 10 and the insulating non-foam rubber coating layer 20, their original performance is maintained before and after the soldering process. Also, before and after the soldering process, the electrical conductivity and elastic resilience are excellent.

For example, a bottom of the heat-resistant polymer film 30 may have a structure for improving a soldering operation with a printed circuit board, and a top may be partially horizontal such that a reflow soldering process can be performed through a surface-mounting process with a vacuum pick-up process.

2. Another Embodiment

Figure 2:
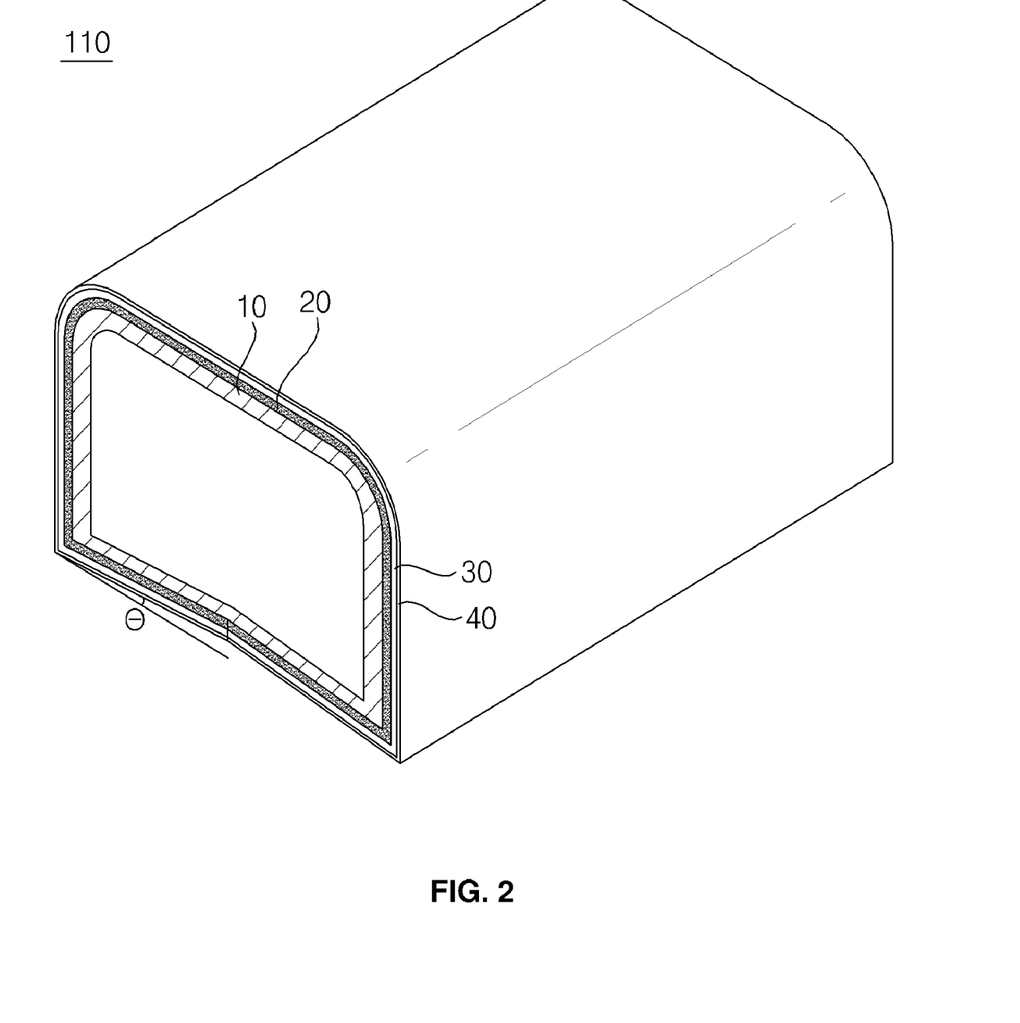
FIG. 2 is a view of an electric contact terminal according to another embodiment of the present invention.

FIG. 2 is a view of an electric contact terminal 110 according to another embodiment of the present invention.

Referring to FIG. 2, a bottom of an insulating elastic core 10 may be slantly formed in a width direction from both ends toward a middle portion in a scoop shape. A slant angle θ may vary according to a physical property (e.g., the coefficient of thermal expansion) and dimensions of a silicon rubber. For example, the slant angle θ may range from about 1° to 10°.

In this structure, since the bottom of the insulating elastic core 10 has the scoop shape from the both ends toward the middle portion, when being surface-mounted to a printed circuit board, a solder cream applied on a ground pattern fills the scoop shape, so that the both ends of the bottom of the insulating elastic core 10 does not come off but is reliably installed with the solder cream. Accordingly, solder-rising phenomenon is increased at both side surfaces of a metal layer 40 to further improve a soldering strength and prevent coming off phenomenon in one direction.

3. Further Another Embodiment

Figure 3:
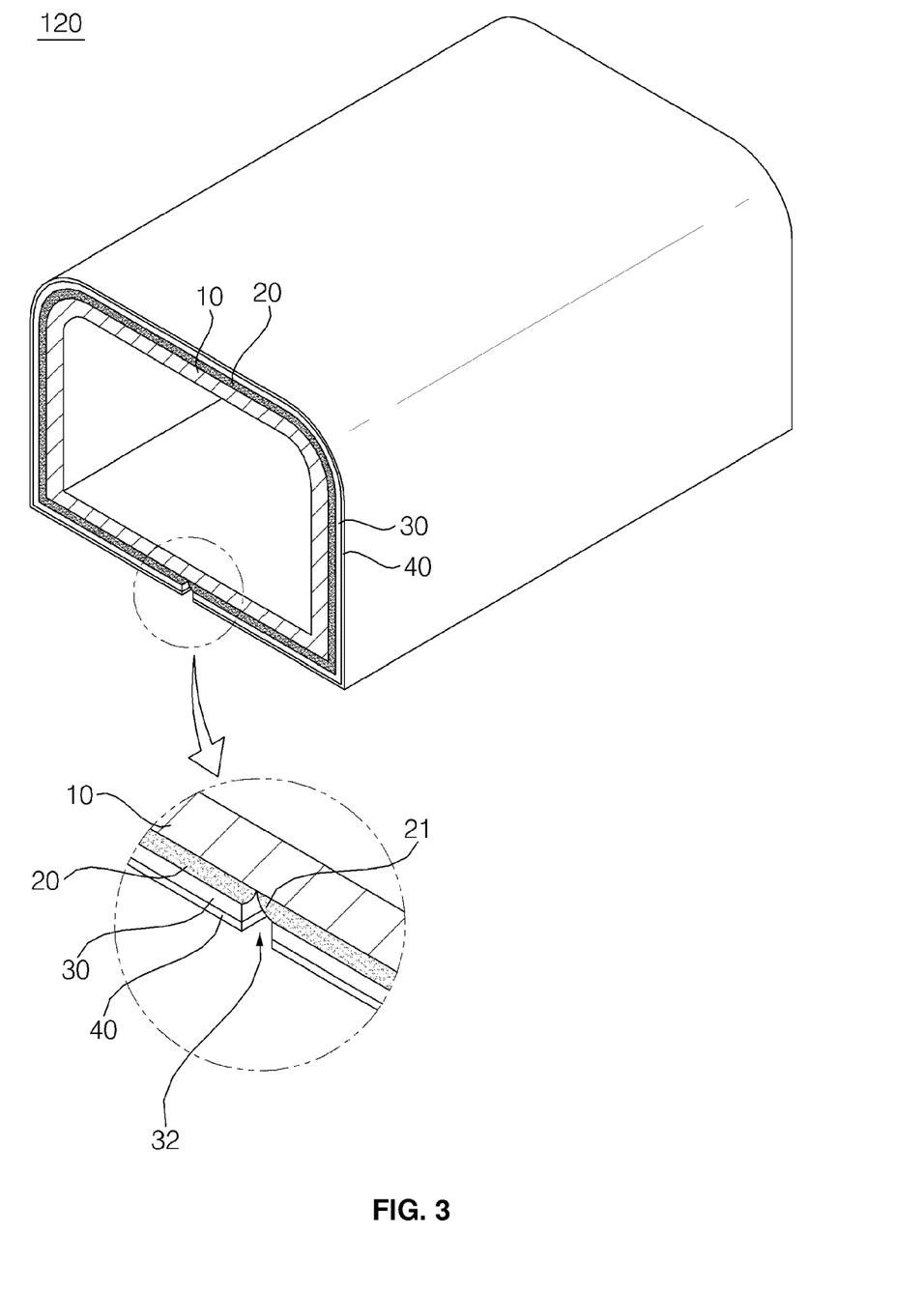
FIG. 3 is a view of an electric contact terminal according to a further another embodiment of the present invention.

FIG. 3 is a view of an electric contact terminal 120 according to a further another embodiment of the present invention.

Referring to FIG. 3, both ends of a heat-resistant polymer film 30 are spaced a predetermined distance from each other to form a receiving space 32, and adhered to an insulating non-foam rubber coating layer 20. In this structure, when the heat-resistant polymer film 30 provided with the liquid insulating non-foam rubber coating layer 20 is passed through a mold (not shown) and compressed to achieve adhesion through heat hardening, an outside pressure due to the mold causes the liquid insulating non-foam rubber coating layer 20 to stick out of the both ends of the heat-resistant polymer film 30 to generate a leakage 21 that is received in the receiving space 32 formed by the spaced both ends of the heat-resistant polymer film 30.

Thus, after the hardening, the solid leakage 21 of the insulating non-foam rubber coating layer 20, sticking out on an outer side of a metal layer 40 does not interfere in a soldering operation for the metal layer 40. Also, in the state where the leakage 21 on which the soldering operation is not performed is received in the receiving space 32, when the soldering process is performed on the electric contact terminal 120 on a PCB, coming off phenomenon is prevented, and a soldering strength is increased.

For example, the receiving space 32 may be bilaterally symmetrical about a center of a bottom of an insulating elastic core 10 to provide similar soldering strengths to lateral surfaces of the electric contact terminal 120 after a reflow soldering process. Also, the receiving space 32 distinguishes a top of the electric contact terminal 120 from the bottom. For example, the width of the receiving space 32 may depend on the width of the electric contact terminal 120 and be about 0.1 mm or more. Also, the polymer film 30 having the expensive metal layer 40 is not attached to the receiving space 32, thereby reducing costs.

In addition, since a solder cream is soldered to only the metal layer 40, the solder cream disposed in the receiving space 32 moves toward both side surfaces of the metal layer 40 during the soldering operation, thereby increasing the soldering strength.

Specifically, such as the embodiment of FIG. 2, when the bottom of the insulating elastic core 10 is slantly formed in a scoop shape from both ends toward a middle portion in a width direction to define the receiving space 32, a space for receiving the leakage 21 of the insulating non-foam rubber coating layer 20 can be further substantially increased.

Also, in this structure, the receiving space 32 clearly distinguishes the top of the electric contact terminal 120 from the bottom thereof, thereby achieving convenient reel packaging with a vacuum pick-up process.

4. Still Further Another Embodiment

Figure 4:
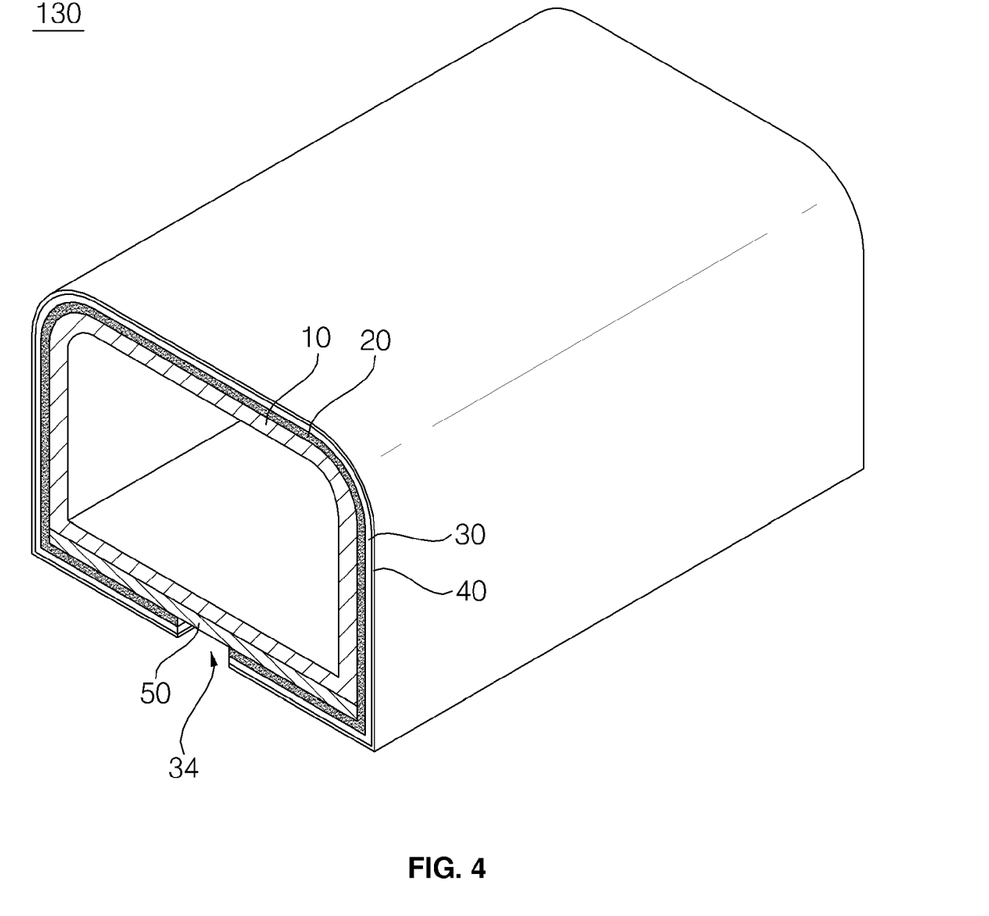
FIG. 4 is a view of an electric contact terminal according to a still further another embodiment of the present invention.

FIG. 4 is a view of an electric contact terminal 130 according to a still further another embodiment of the present invention.

Referring to FIG. 4, a metal reinforcement 50 is disposed at a bottom of an elastic core 10, and then an assembly including the elastic core 10 and the metal reinforcement 50 is enclosed with a heat-resistant polymer film 30 including a metal layer 40 on an outer surface thereof while interposing an insulating non-foam rubber coating layer 20 between the assembly and the heat-resistant polymer film 30. At this point, both ends of the heat-resistant polymer film 30 are spaced from each other to form a gap 34.

According to this embodiment, when the electric contact terminal 130 is surface-mounted to a PCB, a solder cream is in contact with the metal reinforcement 50 through the gap 34 to increase an adhesive force after a soldering process. Also, the gap 34 easily distinguishes an upper part of the electric contact terminal 130 from a lower part thereof, and in the case of a light-weight product, the self weight of the metal reinforcement 50 prevents the movement of the product due to wind supplied in a surface mounting process with a vacuum pick-up process.

5. Even Further Another Embodiment

Figure 5:
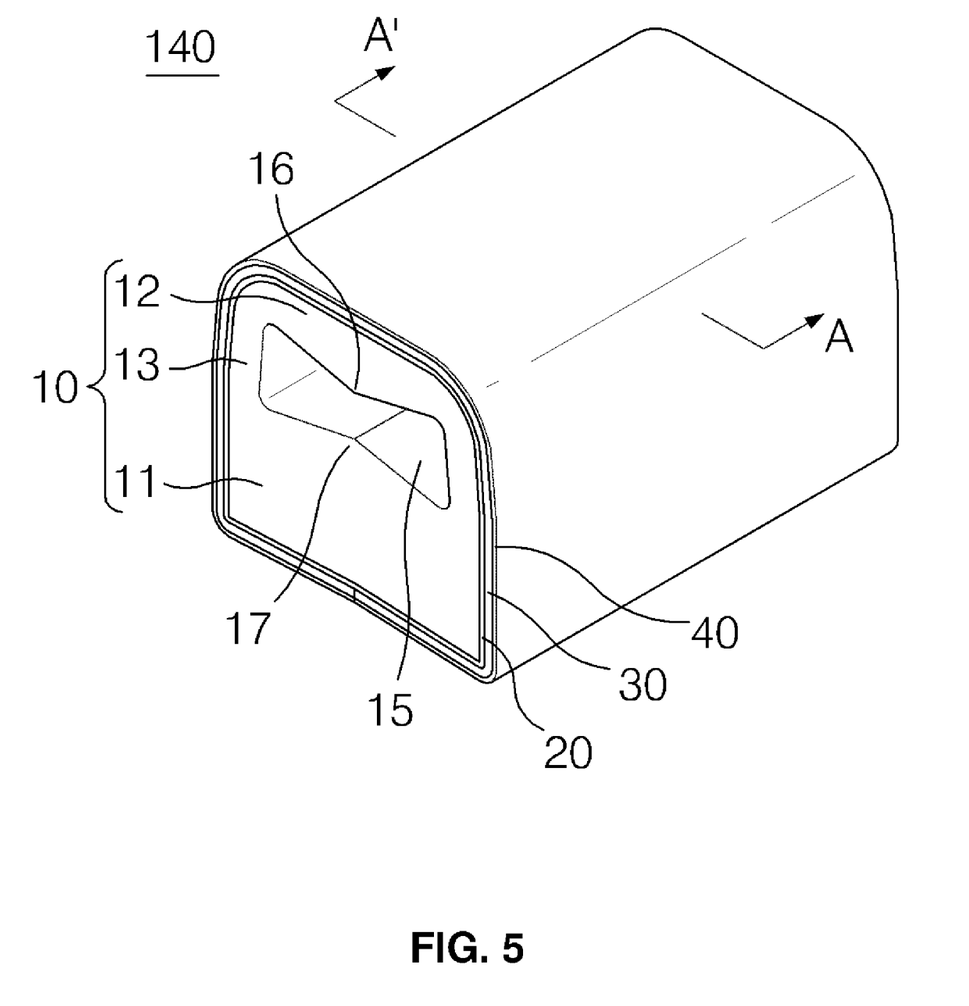
FIG. 5 is a view of an electric contact terminal according to an even further another embodiment of the present invention.

FIG. 5 is a view of an electric contact terminal 140 according to an even further another embodiment of the present invention.

An insulating elastic core 10, having a tube shape, includes a through hole 15 in an inner portion thereof. A cross-section of the elastic core 10 may be circular or tetragonal, but not limited thereto. Various shapes of the cross section are provided according to extrusion processes.

As described above, the hardness of the insulating elastic core 10 may range Shore A 40 to 70 for appropriate mechanical strength and elasticity, and a pressing force for a top of the insulating elastic core 10 is determined according to a size and a shape of the through hole 15 disposed in the inner portion.

The through hole 15 in the inner portion of the elastic core 10 may be disposed in an upper part of the insulating elastic core 10 such that the center of gravity of the insulating elastic core 10 is disposed in a lower part. That is, referring to FIG. 5, a lower portion 11 of the insulating elastic core 10 has a larger thickness than other portions 12 and 13, so that the through hole 15 is disposed in the upper part. In this structure, the center of the gravity of the insulating elastic core 10 is disposed in the lower part, thereby achieving the arrangement of upper and lower surfaces through vibration in a reel packaging operation, and reducing movement in a reflow soldering operation. In addition, the lower portion 11 of the insulating elastic core 10 is thick to increase a self weight thereof and limit a pressing extent of an outside pressure, thereby placing the upper portion 12 in as nearly a horizontal position as possible when contacting a facing object. For example, in the thickness of the insulating elastic core 10, the lower portion 11 is thickest, and the both side portions 13 are thinnest to reduce the pressing force and keep the upper portion 12 in equilibrium.

The through hole 15 passing through the insulating elastic core 10 may be tetragonal, polygonal, circular, or oval.

In the case where the through hole 15 is tetragonal, the both side portions 13 with respect to the through hole 15 decreases in width in an upper direction, which are symmetrical and slanted, and an outer surface of the insulating elastic core 10 may also be slanted, corresponding to the both side portions 13. In this structure, pressure applied by an object contacting the top of the insulating elastic core 10 is dispersed outside of both side surfaces of the insulating elastic core 10 to prevent slanting of an upper part of the insulating elastic core 10 including the through hole 15.

Also, the upper portion 12 and the lower portion 11 have slanted middle portions to form an upper protrusion 16 and a lower protrusion 17, respectively. In this structure, the upper portion 12 of the insulating elastic core 10 is reinforced with the upper protrusion 16 to prevent a center of the upper portion 12 from being collapsed by pressure applied to the top and maintain a plane. Also, the lower protrusion 17 concentrates weight in the lower portion 11 of the insulating elastic core 10 and limits a deformation height of the through hole 15 by contacting the upper protrusion 16.

For example, the thickness of the both side portions 13 of the insulating elastic core 10 with respect to the through hole 15 may be less than those of the lower and upper portions 11 and 12 to improve press elasticity from the upper part.

6. Yet Further Another Embodiment

Figure 6:
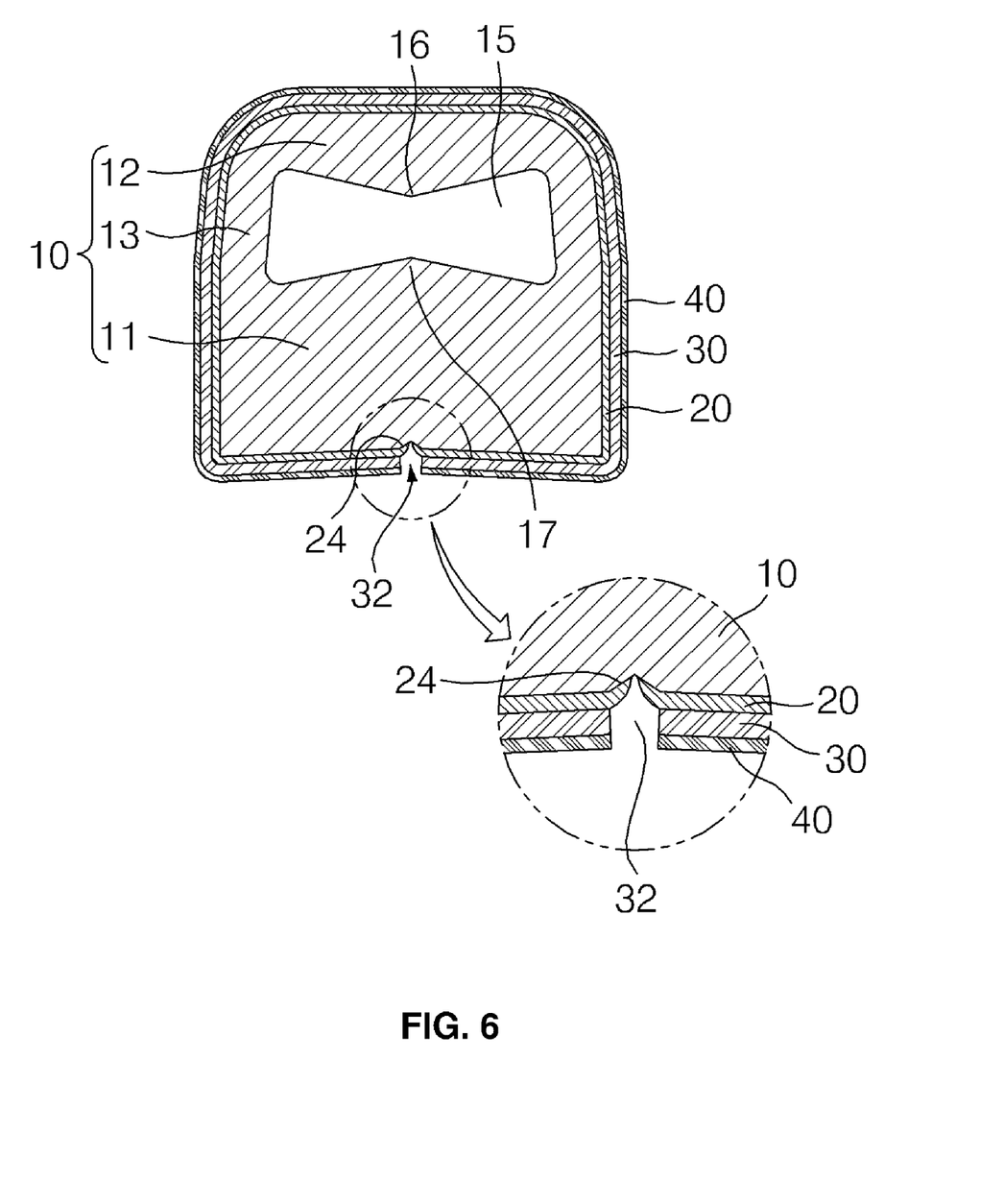
FIG. 6 is a view of an electric contact terminal according to a yet further another embodiment of the present invention.
Figure 7:
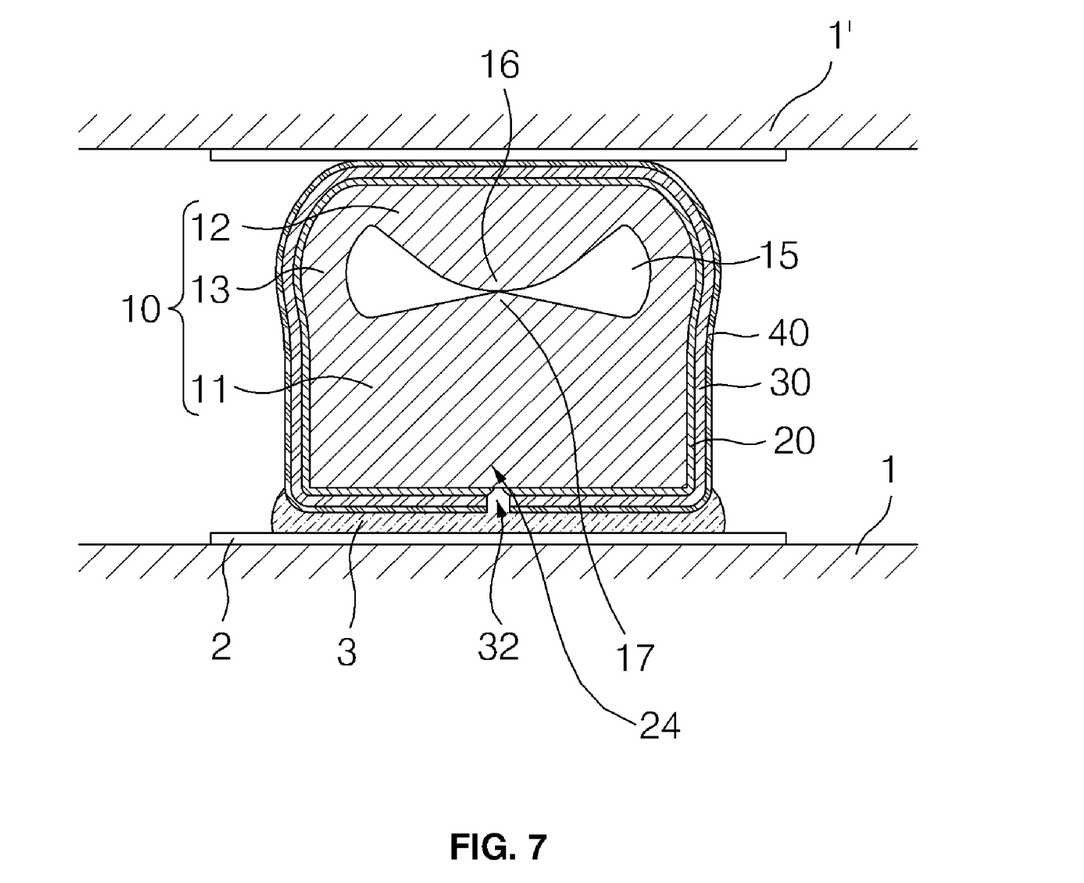
FIG. 7 is a view illustrating an application of the electric contact terminal in FIG. 6 according to an embodiment of the present invention.

FIG. 6 is a view of an electric contact terminal according to a yet further another embodiment of the present invention. FIG. 7 is a view illustrating an application of the electric contact terminal of FIG. 6 according to an embodiment.

Referring to FIG. 6, a receiving groove 24 is longitudinally disposed in a bottom of an insulating elastic core 10 between both ends of a heat-resistant polymer film 30. The receiving groove 24, together with the receiving space 32, receives the greater amount of leakage of the insulating non-foam rubber coating layer 20 to increase a soldering strength, and the receiving groove 24 is adapted for a large size product including the insulating non-foam rubber coating layer 20 in large quantities.

The receiving groove 24, formed through a die in an extrusion process of manufacturing the insulating elastic core 10, may be disposed in an exact center of the insulating elastic core 10 such that the bottom of the insulating elastic core 10 is bisymmetrical.

Thus, the receiving groove 24 disposed in the center of the elastic core 10 helps the receiving space 32 defined by the both ends of the heat-resistant polymer film 30 to be disposed in the center of the bottom of the insulating elastic core 10, thereby preventing coming off phenomenon in one direction in a soldering process. For example, the receiving groove 24 may have a width ranging from about 0.2 mm to 2 mm, a maximum depth ranging from about 0.2 mm to 2 mm, and a V-shape or U-shape, and the width of the receiving space 32 may be about 0.1 mm or more as described above.

Figure 8:
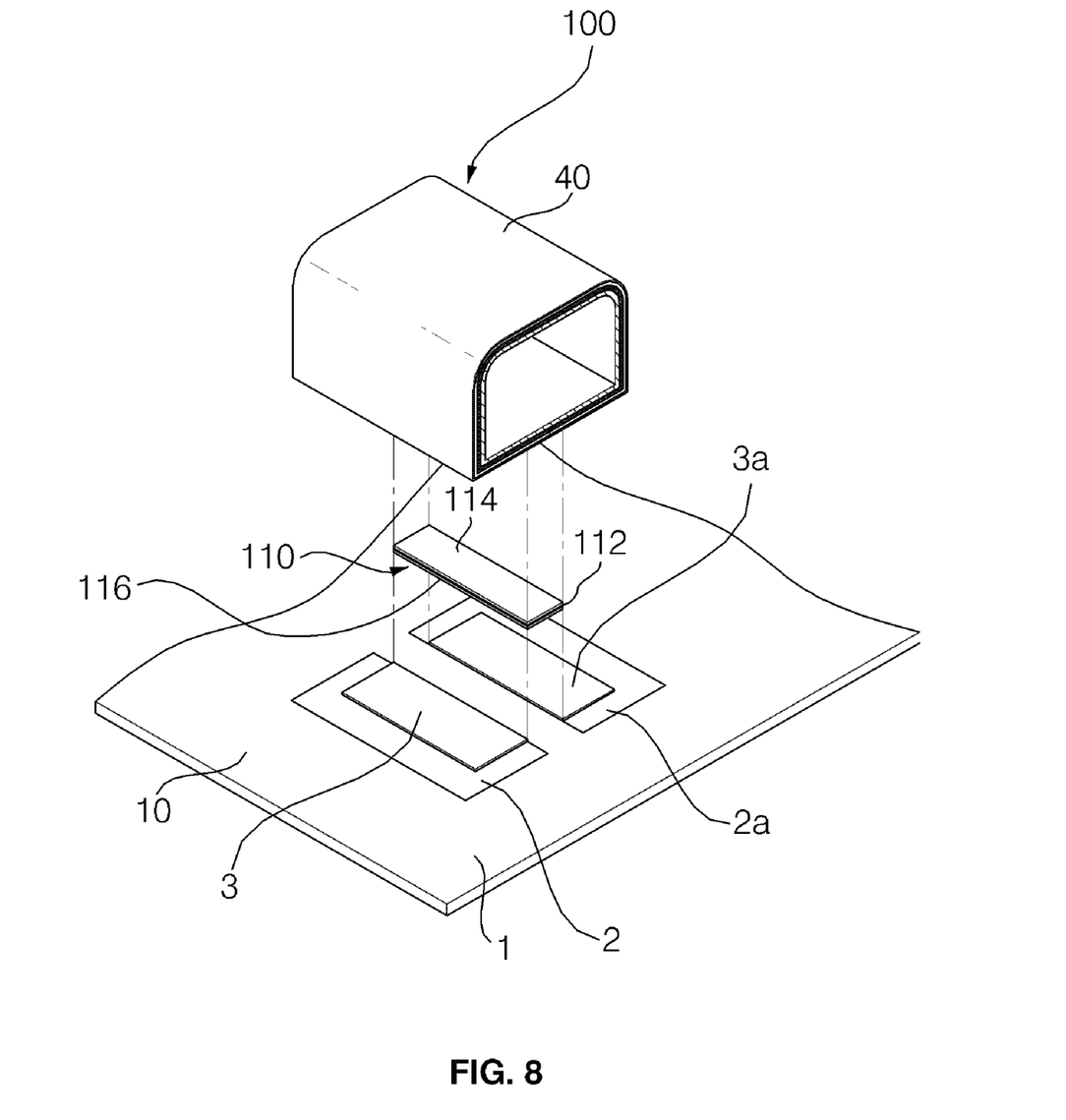
FIG. 8 is a view illustrating the electric contact terminal that is surface-mounted to a printed circuit board according to an embodiment of the present invention.

FIG. 8 is a view illustrating the electric contact terminal 100 that is surface-mounted to a printed circuit board 1 according to an embodiment of the present invention. In this embodiment, as described above, a solder cream and a ground pattern to which the electric contact terminal 100 is soldered are divided into a plurality of ground patterns having an insulating gap, thereby soldering the single electric contact terminal 100 to the plurality of ground patterns.

The metal layer 40 of the electric contact terminal 100 is attached to ground patterns 2 and 2*a* with solder creams 3 and 3*a* disposed there-between. At this point, the ground patterns 2 and 2*a* and the solder creams 3 and 3*a* disposed on the printed circuit board 1 are spaced a predetermined distance from each other to prevent coming off and slanting phenomena of the electric contact terminal 100. Although the ground patterns 2 and 2*a* and the solder creams 3 and 3*a* are separated in a longitudinal direction of the electric contact terminal 100 as illustrated in FIG. 8, they may be separated in a width direction of the electric contact terminal 100, or in the both width and longitudinal directions.

For example, the ground patterns 2 and 2*a* and the solder creams 3 and 3*a* may be separated such that the sizes and the shapes thereof are same and symmetrical to each other, and the sizes thereof are larger than those of the electric contact terminal 100.

Also, the spacing distances of the ground patterns 2 and 2*a* and the solder creams 3 and 3*a* may be about 1 mm or more to improve a soldering strength and the coming-off phenomenon and reduce initial costs, but may range from about 5% to 20% of the length or width of the electric contact terminal 100.

As illustrated in FIG. 8, the solder creams 3 and 3*a* are mixed with flux and conductive metal powder, and applied to surfaces of the respective separated ground patterns 2 and 2*a*.

By applying such ground patterns and patterns of such solder creams, even when the bottom of the electric contact terminal 100 is not flat, the electric contact terminal 100 light relative to its volume can be stably mounted and soldered to the solder cream patterns, and the use of the solder creams can be reduced. In addition, the separated patterns reduce torsion or coming off phenomenon.

Meanwhile, for example, a heat-resistant double-sided adhesive tape 110 may be attached to the metal layer 40 facing the ground patterns 2 and 2*a*. The heat-resistant double-sided adhesive tape 110 includes heat resistant adhesives 114 and 116 respectively attached to an inner surface and an outer surface of a polyimide film 112, in which the heat resistant adhesives may include a silicon rubber based adhesive.

In this structure, when the electric contact terminal 100 is mounted on the solder creams 3 and 3*a* with a vacuum pick-up process, the heat-resistant double-sided adhesive tape 110 directly adheres to the printed circuit board 1 between the ground patterns 2 and 2*a* prior to a soldering process, thereby preventing the torsion phenomenon of the electric contact terminal 100 in a reflow soldering process.

Here, the heat-resistant double-sided adhesive tape 110 can be applied to the embodiments of FIGS. 2 through 4 as well as the embodiment of FIG. 1 without a receiving space.

While the present invention has been described in detail, it should be understood that various changes, substitutions and alterations can be made hereto without departing from the spirit and scope of the invention as defined by the appended claims.

What is claimed is:

1. A solderable elastic electric contact terminal comprising:
   a tube-shaped insulating elastic core;
   an insulating non-foam rubber coating layer adhered to the insulating elastic core to surround the insulating elastic core; and
   a heat-resistant polymer film having one surface adhered to the insulating non-foam rubber coating layer to surround the insulating non-foam rubber coating layer, and another surface integrally provided with a metal layer,
   wherein the insulating elastic core comprises a bottom that is slantly formed in a width direction from both ends toward a middle portion in a scoop shape.

2. The solderable elastic electric contact terminal of claim 1, wherein the insulating elastic core comprises a top having both round edges.

3. The solderable elastic electric contact terminal of claim 1, wherein the insulating non-foam rubber coating layer comprises a powder having a magnetic or piezoelectric characteristic.

4. The solderable elastic electric contact terminal of claim 1, wherein the heat-resistant polymer film integrally provided with the metal layer comprises a single-sided flexible copper clad laminate (FCCL), and a surface of the metal layer is plated with any one of tin, silver, and gold.

5. The solderable elastic electric contact terminal of claim 1, wherein the heat-resistant polymer film is formed of polyimide.

6. The solderable elastic electric contact terminal of claim 1, wherein the insulating elastic core comprises a receiving groove in a bottom thereof, between both ends of the heat-resistant polymer film, in a longitudinal direction of the insulating elastic core.

7. The solderable elastic electric contact terminal of claim 1, wherein the metal layer is partially removed through an etching process.

8. The solderable elastic electric contact terminal of claim 1, wherein the metal layer is soldered to an electrically insulated and divided solder cream.

9. The solderable elastic electric contact terminal of claim 1, wherein the solderable elastic electric contact terminal is adapted for a surface mounting process with a vacuum pick-up process, and a reflow soldering process.

10. A solderable elastic electric contact terminal comprising:
a tube-shaped insulating elastic core including a through hole in an inner portion thereof;
an insulating non-foam rubber coating layer adhered to the insulating elastic core to surround the insulating elastic core; and
a heat-resistant polymer film having one surface adhered to the insulating non-foam rubber coating layer to surround the insulating non-foam rubber coating layer, and another surface integrally provided with a metal layer;
wherein the heat-resistant polymer film is adhered to the insulating non-foam rubber coating layer such that both ends of the heat-resistant polymer film are spaced apart from each other, and when the heat-resistant polymer film is adhered to the insulating non-foam rubber coating layer, a leakage of the insulating non-foam rubber coating layer sticking out of the both ends of the heat-resistant polymer film is received in a receiving space defined by the spaced both ends of the heat-resistant polymer film.

11. The solderable elastic electric contact terminal of claim 10, wherein the through hole is disposed in an upper part of the insulating elastic core.

12. The solderable elastic electric contact terminal of claim 10, wherein both side inner walls of the tube-shaped insulating elastic core disposed with respect to the through hole decrease in width in an upper direction and are symmetrical and slanted, and an outer surface of the insulating elastic core is identically slanted, corresponding to the both side inner walls.

13. The solderable elastic electric contact terminal of claim 10, wherein an upper inner wall and a lower inner wall of the tube-shaped insulating elastic core disposed with respect to the through hole are slanted such that an upper protrusion and a lower protrusion are respectively disposed in middle portions of the upper and lower inner walls.

14. The solderable elastic electric contact terminal of claim 10, wherein both side portions of the tube-shaped insulating elastic core disposed with respect to the through hole are thinner than an upper portion and a lower portion with respect to the through hole to reduce a pressing force from an upper part.

15. The solderable elastic electric contact terminal of claim 10, wherein the insulating elastic core comprises a receiving groove in a bottom thereof, between the both ends of the heat-resistant polymer film, in a longitudinal direction of the insulating elastic core.

16. A solderable elastic electric contact terminal comprising:
a tube-shaped insulating elastic core;
a metal reinforcement on a bottom of the insulating elastic core;
an insulating non-foam rubber coating layer adhered to both the metal reinforcement and the insulating elastic core to surround both the metal reinforcement and the insulating elastic core; and
a heat-resistant polymer film having one surface adhered to the insulating non-foam rubber coating layer to surround the insulating non-foam rubber coating layer, and another surface integrally provided with a metal layer;
wherein both ends of the heat-resistant polymer film are spaced a predetermined distance from each other.

17. A solderable elastic electric contact terminal comprising:
a tube-shaped insulating elastic core;
an insulating non-foam rubber coating layer adhered to the insulating elastic core to surround the insulating elastic core; and
a heat-resistant polymer film having one surface adhered to the insulating non-foam rubber coating layer to surround the insulating non-foam rubber coating layer, and another surface integrally provided with a metal layer,
wherein a heat-resistant double-sided adhesive tape is attached to a portion of a bottom of the metal layer, and the heat-resistant double-sided adhesive tape is directly adhered to a printed circuit board.

18. A solderable elastic electric contact terminal comprising:
a tube-shaped insulating elastic core;
an insulating non-foam rubber coating layer adhered to the insulating elastic core to surround the insulating elastic core; and
a heat-resistant polymer film having one surface adhered to the insulating non-foam rubber coating layer to surround the insulating non-foam rubber coating layer, and another surface integrally provided with a metal layer,
wherein the insulating non-foam rubber coating layer is formed by hardening a liquid elastic rubber paste interposed between the insulating elastic core and the heat-resistant polymer film.

19. The solderable elastic electric contact terminal of claim 18, wherein the insulating elastic core comprises a top having both round edges.

20. The solderable elastic electric contact terminal of claim 18, wherein the insulating non-foam rubber coating layer comprises a powder having a magnetic or piezoelectric characteristic.

21. The solderable elastic electric contact terminal of claim 18, wherein the heat-resistant polymer film integrally provided with the metal layer comprises a single-sided flexible copper clad laminate (FCCL), and a surface of the metal layer is plated with any one of tin, silver, and gold.

22. The solderable elastic electric contact terminal of claim 18, wherein the heat-resistant polymer film is formed of polyimide.

23. The solderable elastic electric contact terminal of claim 18, wherein the insulating elastic core comprises a receiving groove in a bottom thereof, between both ends of the heat-resistant polymer film, in a longitudinal direction of the insulating elastic core.

24. A solderable elastic electric contact terminal comprising:
- a tube-shaped insulating elastic core;
- an insulating non-foam rubber coating layer adhered to the insulating elastic core to surround the insulating elastic core; and
- a heat-resistant polymer film having one surface adhered to the insulating non-foam rubber coating layer to surround the insulating non-foam rubber coating layer, and another surface integrally provided with a metal layer,
- wherein the insulating elastic core comprises a bottom that is slantly formed in a width direction from both ends toward a middle portion in a scoop shape, and the insulating non-foam rubber coating layer is formed by hardening a liquid elastic rubber paste interposed between the insulating elastic core and the heat-resistant polymer film.

25. The solderable elastic electric contact terminal of claim 24, wherein the insulating elastic core comprises a top having both round edges.

26. The solderable elastic electric contact terminal of claim 24, wherein the insulating non-foam rubber coating layer comprises a powder having a magnetic or piezoelectric characteristic.

27. The solderable elastic electric contact terminal of claim 24, wherein the heat-resistant polymer film integrally provided with the metal layer comprises a single-sided flexible copper clad laminate (FCCL), and a surface of the metal layer is plated with any one of tin, silver, and gold.

28. The solderable elastic electric contact terminal of claim 24, wherein the heat-resistant polymer film is formed of polyimide.

29. The solderable elastic electric contact terminal of claim 24, wherein the insulating elastic core comprises a receiving groove in a bottom thereof, between both ends of the heat-resistant polymer film, in a longitudinal direction of the insulating elastic core.

\* \* \* \* \*